United States Patent [19]

Stauffer

[11] 4,024,627

[45] May 24, 1977

[54] PACKAGE MOUNTING OF ELECTRONIC CHIPS, SUCH AS LIGHT EMITTING DIODES

[75] Inventor: Larry Ronald Stauffer, Camp Hill, Pa.

[73] Assignee: AMP Incorporated, Harrisburg, Pa.

[22] Filed: Apr. 29, 1974

[21] Appl. No.: 465,382

[52] U.S. Cl. .................................... 29/588; 29/589; 29/591; 29/627; 357/17
[51] Int. Cl.² ........................................... B01J 17/00
[58] Field of Search ................ 29/576 S, 588, 591, 29/569 L, 589, 626, 627, 577

[56] References Cited

UNITED STATES PATENTS

| | | | |
|---|---|---|---|
| 2,869,040 | 1/1959 | Pifer | 29/626 |
| 2,988,661 | 6/1961 | Goodman | 29/569 L |
| 3,049,647 | 8/1962 | Lincoln | 317/101 CP |
| 3,159,775 | 12/1964 | Ingraham | 29/626 |
| 3,818,279 | 6/1974 | Seeger | 29/626 |

*Primary Examiner*—W. Tupman
*Attorney, Agent, or Firm*—Russell J. Egan

[57] ABSTRACT

Packaging of electronic chips, such as light emitting diodes and the like, without the use of conventional flying leads and ultrasonic bonding is disclosed. The subject packaging and mounting of electronic chips is primarily intended for use with flat flexible cables and similar circuitry which is printed onto flexible insulator substrates. A portion of the circuitry on the insulator substrate is broken by a sharp instrument to form a break or slot in both the conductor and substrate. An electronic chip, such as a light emitting diode, is inserted edge wise into the slot with the opposing surfaces thereof in contact with the conductor of the circuit on either side of the slot. The mechanical friction between the chip and the edges of the slot are sufficient to hold the chip in place while maintaining satisfactory electrical contact. However, the chip can be bonded to the circuit by any known means including solder reflow, conductive epoxys and encapsulation with suitable material.

6 Claims, 6 Drawing Figures

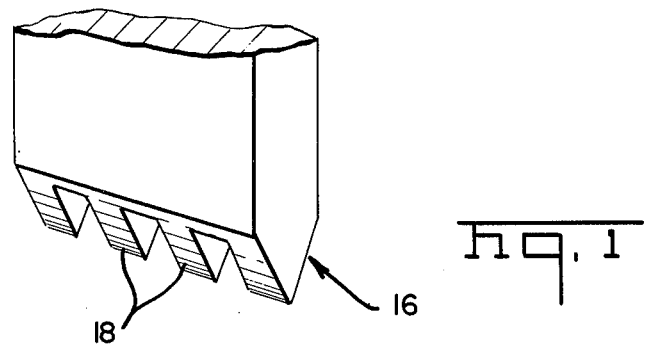
Fig. 1
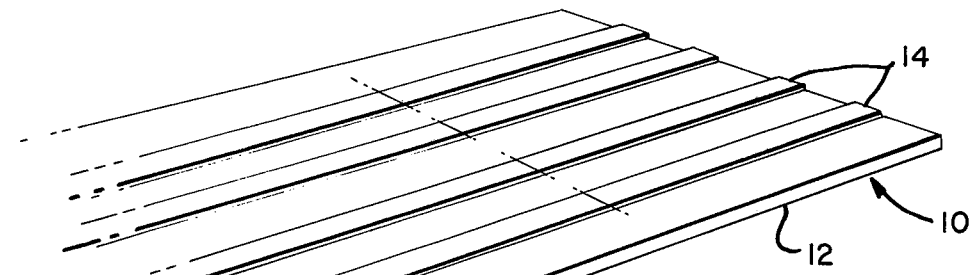
Fig. 2
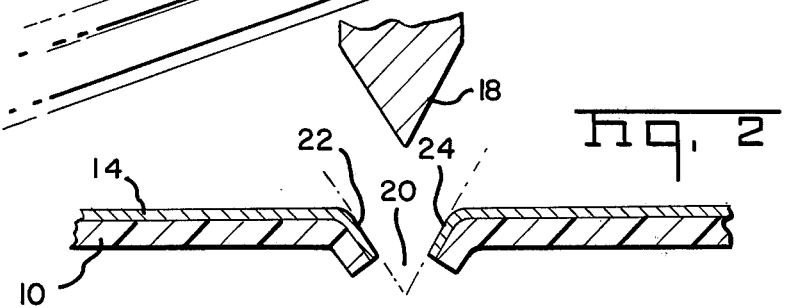
Fig. 3
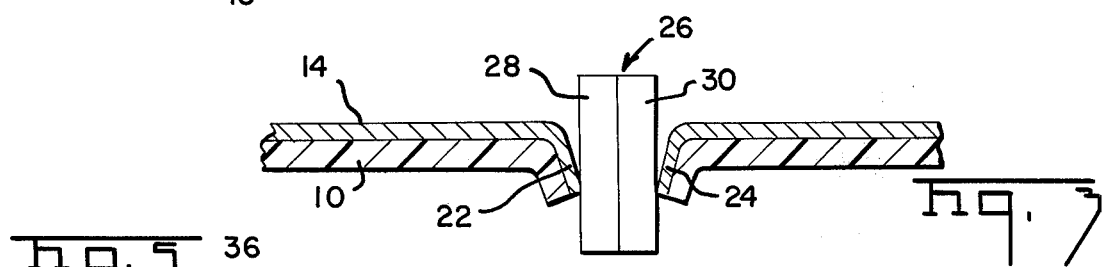
Fig. 5    Fig. 4
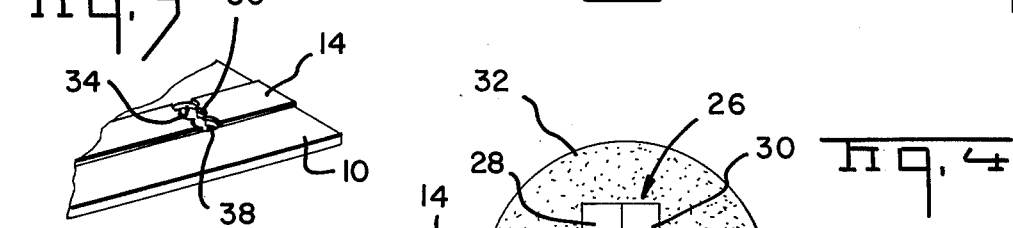
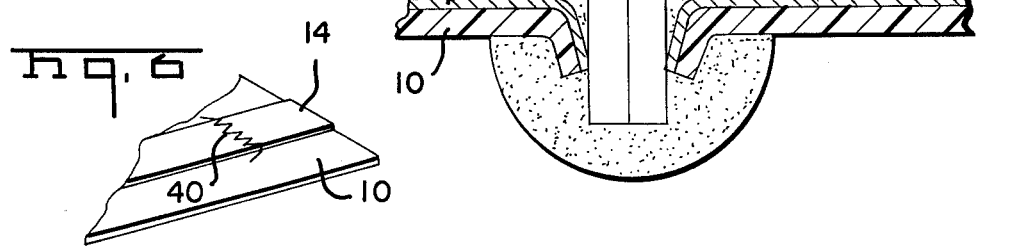
Fig. 6

PACKAGE MOUNTING OF ELECTRONIC CHIPS, SUCH AS LIGHT EMITTING DIODES

BACKGROUND OF THE INVENTION

The Field Of The Invention

The present invention relates to package mounting of electronic chips, such as light emitting diodes and the like, in circuitry formed on flat flexible insulator substrates and in particular to the mounting of chips without the use of flying leads, ultrasonic bonding, etc.

The Prior Art

Conventionally electronic chips are provided with at least two contact pads which must be connected to associated circuitry. Taking a light emitting diode as a specific example, contact pads are formed by solid plating on one side of the diode substrate and an accurately positioned grid plated on the opposite side. The purpose of this grid, which may have almost any geometric configuration, is to evenly distribute the voltage across the face of the diode for a more uniform output. The grids must be accurately positioned during masking and plating of the pad and extreme accuracy must be used in cutting the diode because of the need for the pad to be centered on the chip face. One lead is attached to the grid pad of the chip by welding, thermocompression bonding, ultrasonic bonding, conductive epoxy bonding, fusion welding, percussion welding, electron beam welding, etc., all of which need this configuration to attach the lead without masking or unnecessarily obscuring the face in order to allow emission of sufficient light from the diode.

The conventional manner for mounting an electronic chip, such as a light emitting diode, is to bond one pad of the chip against a first conductor of associated circuitry and then bond a second lead to another pad and to a further conductor forming a portion of the associated circuitry. In the case of diodes, the pads are the opposite faces of the substrate as discussed above. This method of attachment has heretofore required a great deal of accuracy and has been performed manually with the aid of high powered binocular microscopes. Even a skilled worker working with these devices cannot achieve a very high rate of production.

The above mentioned conventional method of mounting diodes is particularly disadvantageous when considering light emitting diodes since one or the other or possibly both faces of the diode can be substantially obscured by the conductors or the bonding material. If further does not allow for the maximum light emission of the diodes, which is achieved from the edge of the diode.

SUMMARY OF THE INVENTION

The present invention is directed towards package mounting of electronic chips, such as light emitting diodes, on flat flexible circuitry. An insulating substrate carrying circuitry printed thereon is slotted by a sharp implement penetrating from the circuitry side of the substrate. The chip is inserted into the formed slot in an edge wise fashion with the separate portions of the circuit making contact with opposite sides of the chip. The inherent resiliency of the severed substrate and circuitry is sufficient to bias the circuitry into adequate mechanical and electrical contact with the faces of the chip. The chip thus mounted can be fixed to the circuit by conventional bonding means, including reflow of solder and applications of conductive epoxys, and the entire package can be encapsulated by an appropriate medium.

It is therefore an object of the present invention to accomplish mounting and electrical connection of electronic chips into printed circuitry or flat flexible cable without the use of conventional bonding means.

It is a further object of the present invention to teach a method of mounting electronic chips in flexible circuitry which will eliminate the need for conventional leads ultrasonically bonded to at least one edge surface of the chip.

It is yet another object of the present invention to teach a method of package mounting of electronic chips, such as light emitting diodes and the like, which will have a fast assembly time at low cost.

The means for accomplishing the foregoing objects and other advantages of the present invention will become apparent from the following detailed description of a preferred embodiment taken with reference to the accompanying drawings.

BRIEF DESCRIPTION OF THE DRAWINGS

FIG. 1 is a perspective view of a fragment of a flat flexible cable positioned beneath a cutting blade;

FIG. 2 is an instantaneous vertical longitudinal section through the cable of FIG. 1 after having been slotted by the blade;

FIG. 3 is a vertical longitudinal section, similar to FIG. 2, showing a diode inserted into the slot;

FIG. 4 is a vertical longitudinal section through the assembly of FIG. 3 after encapsulation in an appropriate medium;

FIG. 5 is a perspective view of a fragment of flat flexible cable with a slot formed in the conductor by a series of overlapping holes; and FIG. 6 is a perspective view of a fragment of flat flexible cable with a non-linear slot schematically shown in the conductor.

DETAILED DESCRIPTION OF THE PREFERRED EMBODIMENT

The mulit-conductor flat flexible cable shown in FIG. 1 is of a well known type. The cable 10 includes a flexible insulating substrate 12 having a plurality of conductors 14 formed therein. While the conductors have been shown as a plurality of parallel spaced apart linear conductors, clearly any circuitry of any desired configuration would serve. The insulating substrate 12 can be of any type of thin film insulating material, such as Mylar or Kapton, and the circuitry 14 can be formed thereon from soft copper or any copper alloy by any of the conventional methods, such as photo engraving. There is no top insulating coating or layer on the circuitry for reasons which will be described later. This type of cable can be manufactured by well known means, for example according to the teachings of U.S. Pat. No. 3,473,218.

The cable 10 is passed beneath a punching or a slotting blade 16. The blade has a plurality of cutter portions 18 which penetrate the conductors 14 of the cable, as shown in FIG. 2, to break the conductors and the substrate there under forming a slot 20 defined by the broken ends 22, 24 of the conductor 14. It is also possible during this slotting operation to punch out and remove a section of the conductor and its underlying substrate. When the cutting blade 16 is removed from the slot, the severed conductor ends and substrate will retain a deformed configuration as shown. An electronic chip 26, a light emitting diode for example, is inserted into the slot 20 and the edge wise configuration with one face 28 engaging conductor 22 and the other face 30 engaging conductor 24. The chip 26 will be held in position, as shown in FIG. 3, by the resiliency of the conductor ends and substrate which are biased against the faces of the chip.

It has been found that the mechanical engagement of the chip with the sidewalls of the slot are sufficient to hold the chip in place and maintain satisfactory electrical connection therewith. However it may be desirable to insure the permanent placement of the chip by bonding the chip to the circuitry. Such bonding can be accomplished by conventional means, such as by reflow soldering or by the application of a conductive epoxy.

Each chip assembly can be encapsulated in an appropriate material 32 as shown in FIG. 4. The encapsulation of the chip in a transparent material is necessary when the chip is a light emitting diode. In such cases the encapsulation material can include a lensing and/or reflector system.

The above described preferred embodiment of the invention illustrates forming a slot with a simple straight cutting edge. It is well within the perview of this invention to include other configurations to form the above discussed slot by perforating the conductor with a series of overlapping round holes 34, 36, 38, see FIG. 5, to form a series of sharp points on either side of the slot. It is also possible to have a saw tooth blade (not shown) form an irregular edged saw tooth slot 40, see FIG. 6, having a plurality of projections which will make more of a point contact with the opposed faces of the chip.

The concept of punched holes and a straight slit can be combined with the round holes punched in the tape at either end of the slit. The circular portions at each end of the slit will prevent the slit from migrating through the substrate.

The present invention may be subject to many modifications and changes without departing from the spirit or essential characteristics thereof. The above discussed embodiment should therefore be considered in all respects as illustrative and not restrictive of the scope of the invention.

What is claimed is:

1. A method for mounting electronic chips, such as light emitting diodes and the like, in flat flexible circuitry having a patterned circuit of conductive material bonded to a single layer of flexible insulated substrate comprising the steps of:

forming a slot in a portion of said circuitry and said substrate thereunder and dispaceable portions of said circuitry and substrate adjacent opposite sides of said slot, and inserting an electronic chip, whose thickness is greater than the width of said slot, edgewise into said slot to displace said portions of said circuitry on both sides of said slot causing said portions to resiliently engage the respective sides of said chip forming electrical connection therewith and support therefor.

2. The method according to claim 1 further comprising bonding said chip to said circuitry.

3. The method according to claim 2 wherein said bonding comprises reflow solder.

4. The method according to claim 2 wherein said bonding comprises the application of a conductive epoxy.

5. The method according to claim 1 further comprising encapsulating said chip and circuitry in an encapsulating medium.

6. The method according to claim 5 wherein said chip is a light emitting diode and said encapsulating medium is transparent.

* * * * *